(12) United States Patent
Park et al.

(10) Patent No.: US 11,688,465 B2
(45) Date of Patent: Jun. 27, 2023

(54) MEMORY SYSTEM HAVING MEMORY CONTROLLER

(71) Applicant: SK hynix Inc., Gyeonggi-do (KR)

(72) Inventors: Ie Ryung Park, Gyeonggi-do (KR); Wan Je Sung, Gyeonggi-do (KR); Dong Sop Lee, Gyeonggi-do (KR); Bo Seok Jeong, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 72 days.

(21) Appl. No.: 17/360,789

(22) Filed: Jun. 28, 2021

(65) Prior Publication Data
US 2022/0208272 A1 Jun. 30, 2022

(30) Foreign Application Priority Data

Dec. 24, 2020 (KR) .......................... 10-2020-0183762

(51) Int. Cl.
| | | |
|---|---|---|
| *G11C 16/00* | (2006.01) | |
| *G11C 16/10* | (2006.01) | |
| *G11C 16/14* | (2006.01) | |
| *G11C 16/34* | (2006.01) | |
| *G11C 16/08* | (2006.01) | |

(Continued)

(52) U.S. Cl.
CPC ............ *G11C 16/102* (2013.01); *G11C 16/08* (2013.01); *G11C 16/14* (2013.01); *G11C 16/24* (2013.01); *G11C 16/26* (2013.01); *G11C 16/3495* (2013.01)

(58) Field of Classification Search
CPC ........... G06F 3/0679; G06F 2212/7201; G06F 12/1009; G06F 3/0604; G06F 12/0292; G06F 3/061; G06F 12/0246; G06F 3/064; G06F 3/0659; G06F 3/0652; G06F 3/0631; G06F 2212/7203; G06F 3/0658; G06F 3/0644; G06F 3/0656; G06F 12/02; G06F 12/0873; G06F 12/0882; G06F 16/174; G06F 2212/1044; G06F 2212/7208; G06F 3/0605; G06F 3/0608; G06F 3/0641; G06F 3/0671; G06F 3/0688; G06F 9/30145; G06F 2212/7207; G06F 3/0611; G06F 3/0655;

(Continued)

(56) References Cited

U.S. PATENT DOCUMENTS

2021/0026764 A1* 1/2021 Lee ..................... G06F 12/0873

FOREIGN PATENT DOCUMENTS

| KR | 10-1119614 B1 | 2/2012 |
| KR | 10-2014-0123135 A | 10/2014 |

* cited by examiner

*Primary Examiner* — Thong Q Le
(74) *Attorney, Agent, or Firm* — IP & T Group LLP

(57) ABSTRACT

A memory system includes: a memory block including a plurality of pages each comprising a plurality of memory cells connected to bit lines and a word line of word lines, an address manager configured to output addresses corresponding to the plurality of pages, and a system data manager configured to generate index data corresponding to the each of the addresses, the index data indicating whether user data is inverted, and output the index data and information on a memory cell in which the index data is to be stored, respectively. The system data manager is configured to, determine memory cells connected to different bit lines from among memory cells included in adjacent pages corresponding to consecutive addresses of the addresses, as memory cells in which index data corresponding to the consecutive addresses are to be stored.

20 Claims, 18 Drawing Sheets

(51) Int. Cl.
*G11C 16/24* (2006.01)
*G11C 16/26* (2006.01)

(58) Field of Classification Search
CPC .. G06F 3/0662; G06F 3/0667; G06F 12/0238; G06F 12/06; G06F 12/063
See application file for complete search history.

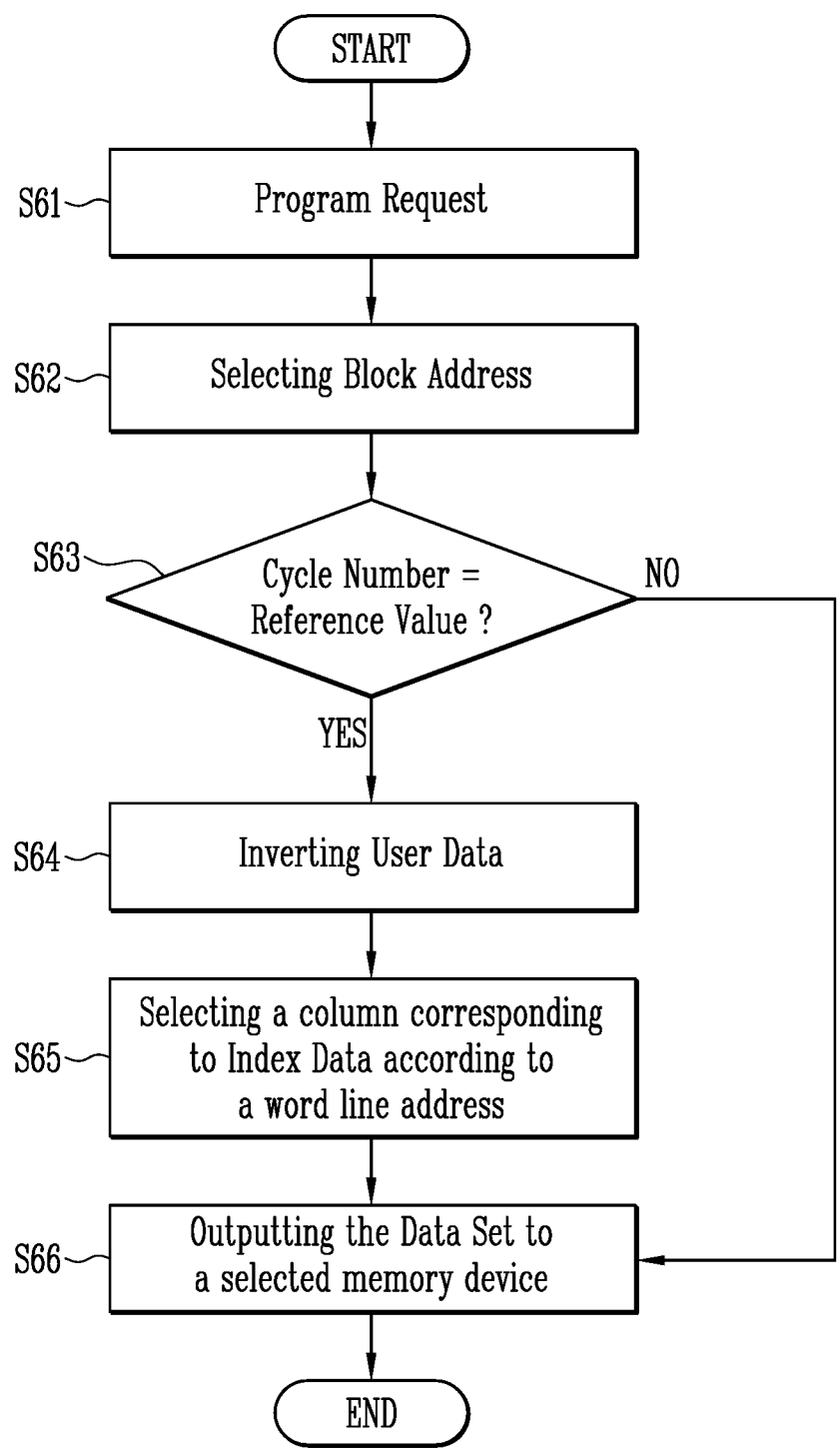

MEMORY SYSTEM HAVING MEMORY CONTROLLER

CROSS-REFERENCE TO RELATED APPLICATION

The present application claims priority under 35 U.S.C. § 119(a) to Korean patent application number 10-2020-0183762 filed on Dec. 24, 2020, which is incorporated herein by reference in its entirety.

BACKGROUND

Field of Invention

The present disclosure generally relates to a memory system having a memory controller, and more particularly, to a memory system having a memory controller, which can generate and manage system data.

Description of Related Art

A memory system may include a storage device capable of storing data and a memory controller capable of controlling the storage device.

The storage device may include memory devices capable of storing data, and the memory devices may be classified into a volatile memory device and a nonvolatile memory device.

The volatile memory device is a memory device in which data is stored only when power is supplied, and stored data disappears when the supply of power is interrupted. The volatile memory device may include a Static Random Access Memory (SRAM), a Dynamic Random Access Memory (DRAM), and the like.

The nonvolatile memory device is a memory device in which stored data does not disappear even when the supply of power is interrupted. The nonvolatile memory device may include a Read Only Memory (ROM), a Programmable ROM (PROM), an Electrically Programmable ROM (EPROM), an Electrically Erasable ROM (EEROM), a flash memory, and the like.

SUMMARY

Various embodiments of the present disclosure provide a memory system having a memory controller, which can prevent a phenomenon in which the same data is stored in flag cells included in the same column.

In accordance with an aspect of the present disclosure, there is provided a memory system including: a memory block including a plurality of pages, wherein each of the plurality of pages comprises a plurality of memory cells connected to bit lines and a word line of word lines; an address manager configured to output addresses corresponding to the plurality of pages, each of the addresses indicating a page where user data is to be stored among the plurality of pages; and a system data manager configured to generate index data corresponding to the each of the addresses, the index data indicating whether the user data is inverted, and output the index data and information on a memory cell in which the index data is to be stored, respectively. The system data manager may be configured to, determine memory cells connected to different bit lines from among memory cells included in adjacent pages corresponding to consecutive addresses of the addresses, as memory cells in which index data corresponding to the consecutive addresses are to be stored.

In accordance with another aspect of the present disclosure, there is provided a memory system including: a memory device including a first memory cell connected to a first bit line and a first word line, a second memory cell connected to a second bit line adjacent to the first bit line and the first word line, a third memory cell connected to the first bit line and a second word line adjacent to the first word line, and a fourth memory cell connected to the second bit line and the second word line; and a memory controller configured to transmit data sets including index data to the memory device in a program operation. The memory controller may generate the data sets such that the index data is stored in the first to fourth memory cells.

In accordance with still another aspect of the present disclosure, there is provided a memory system including: a memory block including a first area in which index data are stored and a second area in which user data are stored; a peripheral circuit configured to program the index data and the user data in the memory block; and a memory controller configured to generate the index data according to a state of the user data, and transmit the user data and the index data to the peripheral circuit. The index data may have a predetermined bit-size. The index data may be stored memory cells connected different bit lines in the first area.

BRIEF DESCRIPTION OF THE DRAWINGS

Embodiments of the present disclosure will now be described more fully hereinafter with reference to the accompanying drawings; however, the embodiments may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 6 is a diagram illustrating a program operation in accordance with an embodiment of the present disclosure.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and should not be construed as limited to the embodiments set forth herein.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing methods herein.

When implemented in at least partially in software, the controllers, processors, devices, modules, units, multiplexers, generators, logic, interfaces, decoders, drivers, generators and other signal generating and signal processing features may include, for example, a memory or other storage device for storing code or instructions to be executed, for example, by a computer, processor, microprocessor, controller, or other signal processing device.

Figure 1:
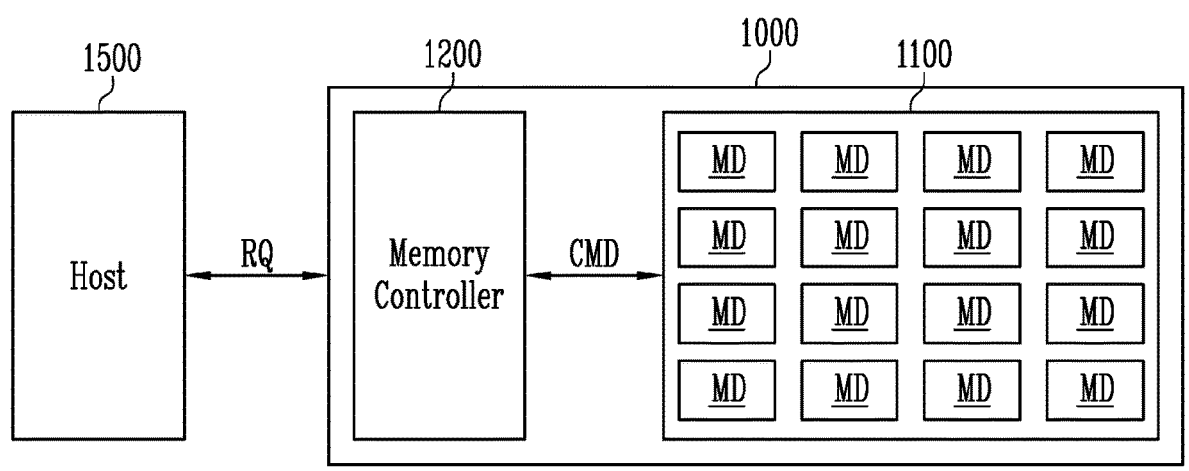
FIG. 1 is a diagram illustrating a memory system in accordance with an embodiment of the present disclosure.

FIG. 1 is a diagram illustrating a memory system in accordance with an embodiment of the present disclosure.

Referring to FIG. 1, the memory system 1000 may include a storage device 1100 and a memory controller 1200. The storage device 1100 may include a plurality of memory devices MD, and the memory devices MD may be connected to the memory controller 1200 through input/output lines.

The memory controller 1200 may communicate between a host 1500 and the memory device MD. The memory controller 1200 may generate a command CMD for controlling the memory devices MD according to a request RQ of the host 1500, and perform a background operation for performance improvement of the memory system 1000 even when the request RQ of the host 1500 does not exist.

The host 1500 may generate requests RQ for various operations, and output the generated requests RQ to the memory system 1000. For example, the requests RQ may include a program request capable of controlling a program operation, a read request capable of controlling a read operation, an erase request capable of controlling an erase operation, and the like.

The host 1500 may communicate with the memory system 1000 through various communication standards and interfaces such as Peripheral Component Interconnect-Express (PCI-E), Advanced Technology Attachment (ATA), Serial ATA (SATA), Parallel ATA (PATA), Serial Attached SCSI (SAS), Non-Volatile Memory Express (NVMe), a Universal Serial Bus (USB), a Multi-Media Card (MMC), an Enhanced Small Disk Interface (ESDI), and Integrated Drive Electronics (IDE).

The memory controller 1200 in accordance with this embodiment may transmit a command CMD for a program operation, an address, and data to the memory device MD in the program operation and may receive a data set read from the memory device MD in a read operation. The memory controller 1200 may generate system data related to user data received from the host 1500 and then may transmit a data set including the user data and the system data to a selected memory device MD, the system data being managed by the memory controller 1200. The memory controller 1200 may control the memory device MD to store the user data as one of a non-inverted version and an inverted version according to a number of cycles of program and erase operations (hereinafter, shortly referred to as the number of cycles) of the memory device MD. When storing the user data into the memory device MD, the memory controller 1200 may generate index data representing whether the user data is stored as the non-inverted version or the inverted version and may include the index data into the system data related to the user data (inverted or non-inverted) to generate the data set. The memory controller 1200 may change a position, e.g., a column of the index data included in the data set. For example, the column means an area (e.g., a memory cell) determined according to a string or a bit line in a memory block in which the system data is to be stored. For example, in the memory block, a row area (e.g., a page) may be determined according to a word line, and a column area (e.g., a memory cell) may be determined according to a string or a bit line. The column (or a column address) may indicate a storage location (e.g., a location of a memory cell) in a first direction (e.g., a column direction). Here, the first direction may be a direction different from a second direction (e.g., a row direction) in which pages are arranged. The column may indicate an arrangement of a plurality of bit lines.

Therefore, in a read operation, the memory controller 1200 may determine a state of the user data according to the system data of the data set read from the memory device MD. For example, when the index data represents, in the system data, that the read user data related to the index data is the inverted version, the memory controller 1200 may determine that the read user data is the inverted data and may recover the read user data to the non-inverted data and then output the original user data (i.e., the non-inverted data) to the host 1500.

The memory device MD shown in FIG. 1 will be described in detail as follows.

Figure 2:
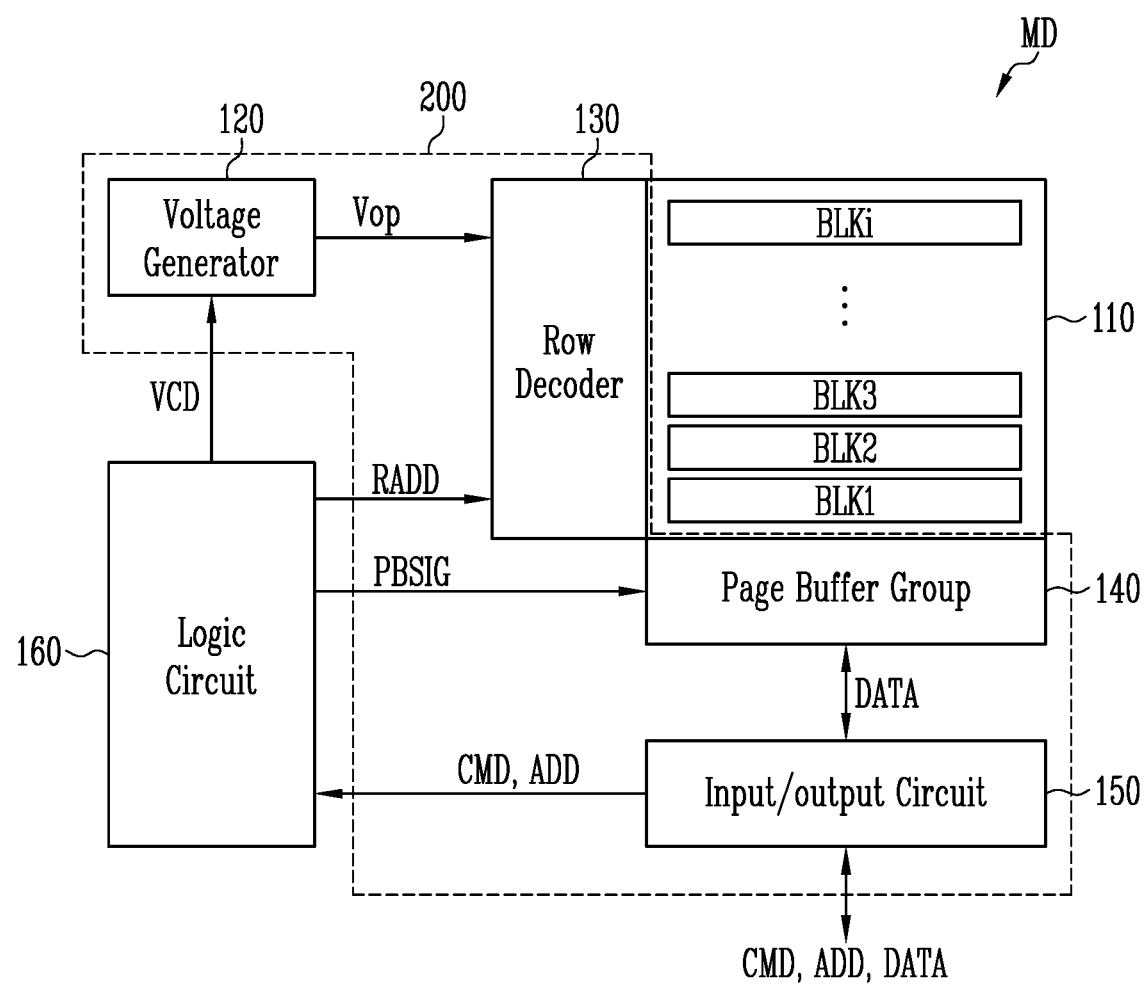
FIG. 2 is a diagram illustrating a memory device.

FIG. 2 is a diagram illustrating the memory device.

Referring to FIG. 2, the memory device MD may include a memory cell array 110 in which data is stored, a peripheral circuit 200 for performing a program, read or erase operation, and a logic circuit 160 for controlling the peripheral circuit 200.

The memory cell array 110 may include a plurality of memory blocks BLK1 to BLKi (i is a positive integer) in which data is stored. Each of the memory blocks BLK1 to BLKi may include a plurality of memory cells. The memory cells may be implemented in a two-dimensional structure in which the memory cells are arranged in parallel to a substrate or a three-dimensional structure in which the memory cells are stacked in a vertical direction over a substrate.

The peripheral circuit 200 may include a voltage generator 120, a row decoder 130, a page buffer group 140, and an input/output circuit 150.

The voltage generator 120 may generate and output operating voltages Vop necessary for various operations in response to a voltage code VCD. For example, the voltage generator 120 may generate and output the operating voltages Vop including a program voltage, a verify voltage, a read voltage, a pass voltage, an erase voltage, and the like.

The row decoder 130 may select one memory block among the memory blocks BLK1 to BLKi included in the memory cell array 110 according to a row address RADD, and transmit the operating voltages Vop to the selected memory block.

The page buffer group 140 may be connected to the memory cell array 110 through bit lines. For example, the page buffer group 140 may include page buffers connected to the respective bit lines. The page buffers may simultaneously operate in response to page buffer control signals PBSIG, and temporarily store data in a program or read operation.

The input/output circuit 150 may be connected to the memory controller (1200 shown in FIG. 1) through input/output lines. The input/output circuit 150 may input/output a command CMD, an address ADD, and data DATA through the input/output lines. For example, the input/output circuit 150 may transmit, to the logic circuit 160, the command CMD and the address ADD, which are received through the input/output lines, and transmit the data DATA received through the input/output lines to the page buffer group 140. The input/output circuit 150 may output data DATA received from the page buffer group 140 to the memory controller 1200 through the input/output lines. The data DATA may be the data set described with reference to FIG. 1.

The logic circuit 160 may output the voltage code VCD, the row address RADD, and the page buffer control signals PBSIG in response to the command CMD and the address ADD. For example, the logic circuit 160 may include software for performing an algorithm in response to the command CMD and hardware configured to output various signals according to the address ADD and the algorithm.

Figure 3:
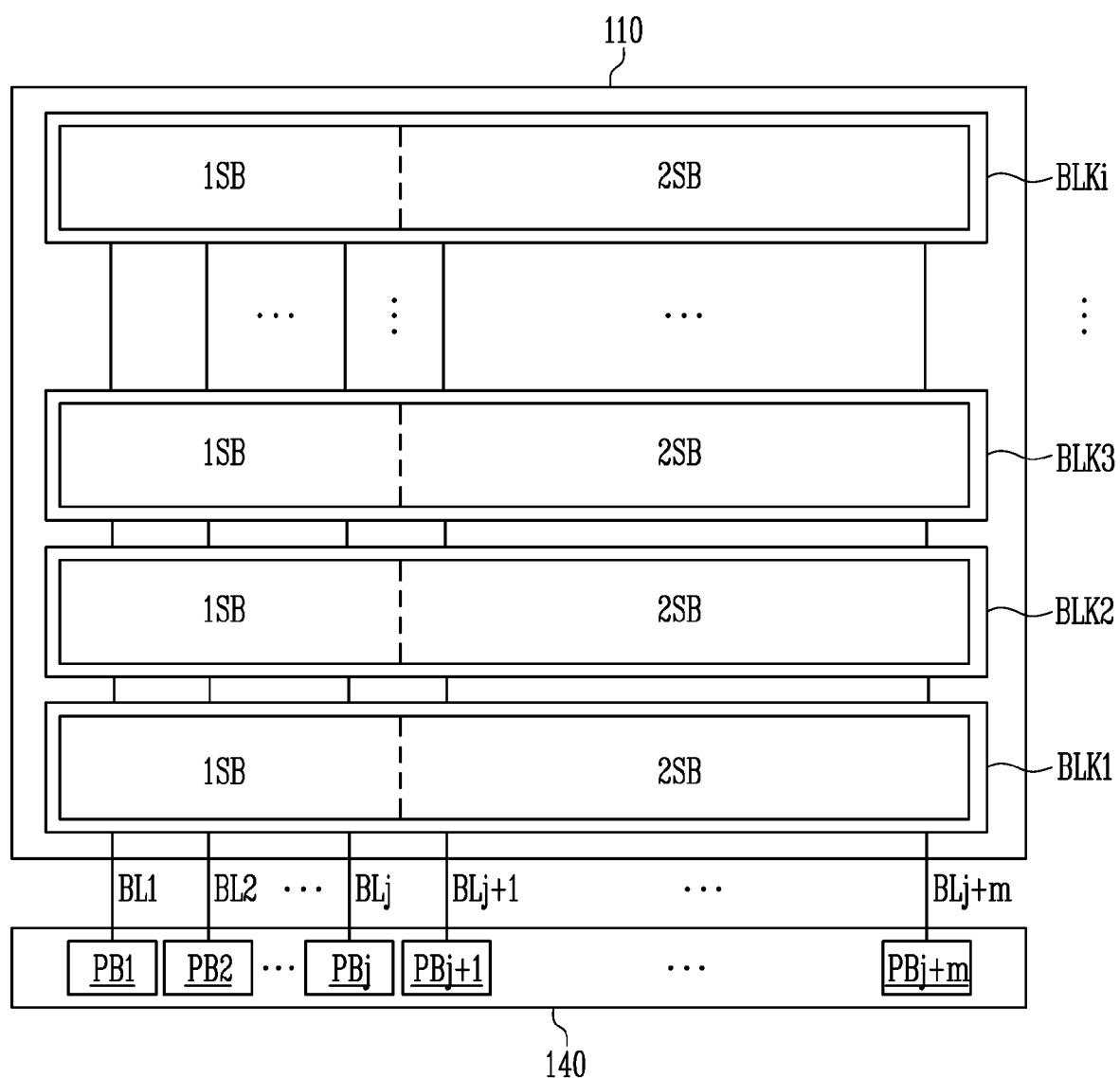
FIG. 3 is a diagram illustrating a memory cell array and a page buffer group.

FIG. 3 is a diagram illustrating a memory cell array and a page buffer group.

Referring to FIG. 3, the memory cell array 110 may include first to ith memory blocks BLK1 to BLKi. Each of the first to ith memory blocks BLK1 to BLKi may include a plurality of areas in which different types of data can be stored. For example, each of the first to ith memory blocks BLK1 to BLKi may include first and second sub-blocks 1SB and 2SB corresponding to different areas. The first sub-blocks 1SB may be commonly connected to first to j-th bit lines BL1 to BLj (j is a positive integer), and the second sub-blocks 2SB may be commonly connected to (j+1)-th to (j+m)-th bit lines BLj+1 to BLj+m. System data may be stored in the first sub-blocks 1SB, and user data may be stored in the second sub-blocks 2SB. Therefore, a storage capacity of the first sub-blocks 1SB is less than that of the second sub-blocks 2SB. That is, a number of memory cells included in the first sub-blocks 1SB is less than that of memory cells included in the second sub-blocks 2SB. In some embodiments, the memory cells included in the first sub-blocks 1SB may be defined as flag cells, and the memory cells included in the second sub-blocks 2SB may be defined as normal memory cells.

The page buffer group 140 may include first to j-th page buffers PB1 to PBj commonly connected to the first sub-blocks 1SB and (j+1)-th to (j+m)-th page buffers PBj+1 to PBj+m commonly connected to the second sub-blocks 2SB. In a program operation, a data set received from the memory controller may be stored in the first to (j+m)-th page buffers PB1 to PBj+m, and a voltage of the first to (j+m)-th bit lines BL1 to BLj+m may be determined according to the data set stored in the first to (j+m)-th page buffers PB1 to PBj+m.

In the program operation, a selected memory block among the first to ith memory blocks BLK1 to BLKi may be connected to the first to (j+m)-th bit lines BL1 to BLj+m, and selected memory cells included in the selected memory block may be programmed.

Figure 4:
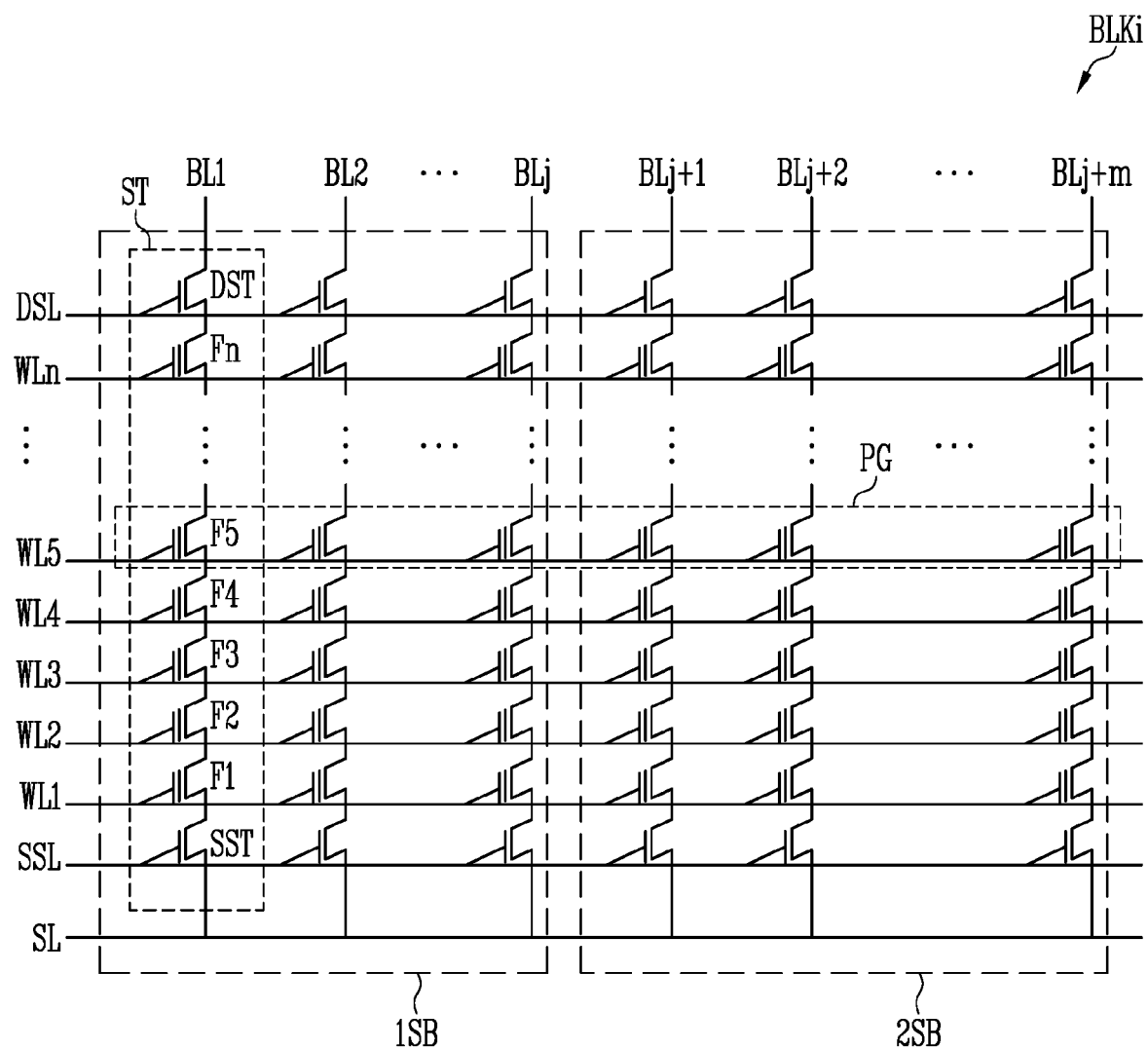
FIG. 4 is a diagram illustrating a memory block.

FIG. 4 is a diagram illustrating a memory block, and the ith memory block BLKi among the plurality of memory blocks BLK1 to BLKi shown in FIG. 3 is illustrated as an example.

Referring to FIG. 4, the ith memory block BLKi may include a plurality of strings ST. The plurality of strings ST may be connected between the first to (j+m)-th bit lines BL1 to BLj+m and a source line SL. For example, one string ST may be connected between the first bit line BL1 and the source line SL, and one string ST may be connected between the second bit line BL2 and the source line SL. In this manner, one string ST may also be connected between the (j+m)-th bit line BLj+m and the source line SL.

A plurality of strings ST may be included in each of the first sub-block 1SB and the second sub-block 2SB, and a number of strings ST included in the first sub-block 1SB may be different from that of strings ST included in the second sub-block 2SB. When it is set that system data is stored in the first sub-block 1SB and user data is stored in the second sub-block 2SB, the number of strings ST included in the first sub-block 1SB may be less than that of strings ST included in the second sub-block 2SB. Each of the strings ST included in the first and second sub-blocks 1SB and 2SB may include a source select transistor SST, first to nth memory cells F1 to Fn, a drain select transistor DST. The string ST connected to the first bit line BL1 will be described in detail as an example.

The source select transistor SST included in the string ST may electrically connect the source line SL and the first memory cell F1 or interrupt connection between the source line SL and the first memory cell F1 according to a voltage applied to a source select line SSL. Gates of the first to nth memory cells F1 to Fn included in the string ST may be respectively connected to first to nth word lines WL1 to WLn. The drain select transistor DST included in the string ST may electrically connect the first bit line BL1 and the nth memory cell Fn or interrupt connection between the first bit line BL1 and the nth memory cell Fn according to a voltage applied to a drain select line DSL. Gates of source select transistors SST included in different strings ST may be commonly connected to the source select line SSL, gates of first to nth memory cells F1 to Fn included in different strings ST may be connected to the first to nth word lines WL1 and WLn, and gates of drain select transistors DST included in different strings may be commonly connected to the drain select line DSL. A group of memory cells connected to the same word line is referred to as a page PG, and program and read operation may be performed in units of pages PG.

A program operation in accordance with an embodiment may be performed by using an incremental step pulse program (ISPP) method in which a program voltage is stepwisely increased. In the program operation using the ISPP method, a plurality of program loops may be performed until a threshold voltage of selected memory cells is increased to a target voltage, and the program voltage may be stepwisely increased whenever the program loop is performed.

The first to nth memory cells F1 to Fn may be programmed or read in various manners according to a number of stored bits. For example, 1-bit data may be stored in one memory cell in a single level cell (SLC) manner, and 2 or more-bit data may be stored in one memory cell in a multi-level cell (MLC) manner. For example, 2-bit data may be stored in one memory cell in the MLC manner, 3-bit data may be stored in one memory cell in a triple level cell (TLC) manner, and 4-bit data may be stored in one memory cell in a quadruple level cell (QLC) manner. In addition, 5 or more-bit data may be stored in one memory cell. In the MLC manner or more, data of a plurality of bits, which is stored in one memory cell, may be different logical page data. The TLC manner will be described as an example. In the TLC manner, three logical page data may be stored in one page. The three logical page data may be least significant bit (LSB) data, central significant bit (CSB) data, and most significant bit (MSB) data.

Figure 5:
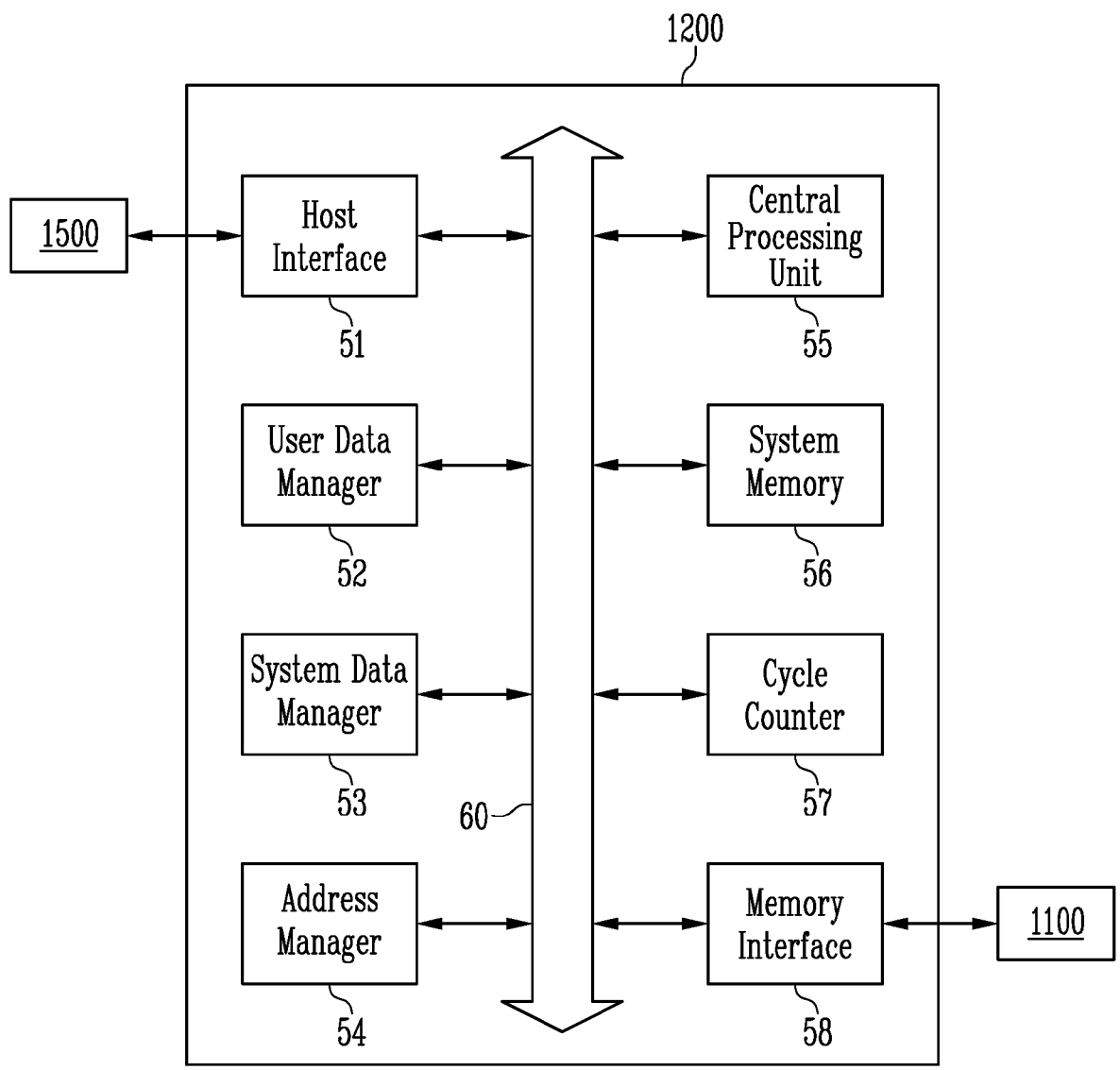
FIG. 5 is a diagram illustrating a memory controller in accordance with an embodiment of the present disclosure.

FIG. 5 is a diagram illustrating a memory controller in accordance with an embodiment of the present disclosure.

Referring to FIG. 5, the memory controller 1200 may include a host interface 51, a user data manager 52, a system data manager 53, an address manager 54, a central processing unit 55, a system memory 56, a cycle counter 57, and a memory interface 58. The host interface 51, the user data manager 52, the system data manager 53, the address manager 54, the central processing unit 55, the system memory 56, the cycle counter 57, and the memory interface 58 may communicate with each other through a bus 60. The host interface 51, the user data manager 52, the system data manager 53, the address manager 54, the system memory 56, the cycle counter 57, and the memory interface 58 may operate under the control of the central processing unit 55. Each unit will be described in detail as follows.

The host interface 51 may transmit a request, an address or data between the host 1500 and the memory controller 1200. For example, when a request output from the host 1500 is received, the host interface 51 may transmit the received request to the central processing unit 55. The central processing unit 55 may change the received request into a command which can be used in the memory system, and may control each of the host interface 51, the user data manager 52, the system data manager 53, the address manager 54, the system memory 56, the cycle counter 57, and the memory interface 58 according to the receive request. For example, under the control of the central processing unit 55, information input to the host interface 51 may be selectively transmitted to the other units 52 to 54 and 56 to 58, and information may be transmitted between different units 52 to 54 and 56 to 58.

The user data manager 52 may transmit user data output from the host interface 51 to the memory interface 58 or change the user data to inverted data and then transmit the inverted user data to the system memory 56. For example, the user data manager 52 may determine whether a number of cycles of a selected memory block corresponds to a reference value in a program operation. When the number of cycles of the selected memory block does not correspond to the reference value, the user data manager 52 may transmit the user data as non-inverted data to the system memory 56. When the number of cycles of the selected memory block corresponds to the reference value, the user data manager 52 may invert the user data and transmit the inverted data to the system memory 56. For example, the reference value may be an odd or even number. When the reference value is an even number, the user data manager 52 may transmit the user data as the non-inverted data to the system memory 56 when the number of cycles of the selected memory block is an odd number, and transmit the inverted user data to the system memory 56 when the number of cycles of the selected memory block is an even number. Therefore, the user data manager 52 may selectively invert the user data for each memory block according to the number of cycles of the memory block.

The system data manager 53 may manage user data in units of pages. For example, the system data manager 53 may generate various information on the user data as system data. For example, the system data may include index data, a parity, and the like. The index data may be data representing whether the user data has been inverted. For example, when the user data is maintained as non-inverted data by the user data manager 52, the system data manager 53 may generate the index data as first index data. The first index data may be set as data 1 selected from data 0 and 1. When the user data is inverted by the user data manager 52, the system data manager 53 may generate the index data as second index data. The second index data may be set as data 0 selected from the data 0 and 1. The data 1 may represent an erased state of a memory cell included in the first sub-block (1SB shown in FIG. 3), and the data 0 may represent a programmed state of a memory cell included in the first sub-block (1SB shown in FIG. 3). When the user data is inverted by the user data manager 52, the system data manager 53 may generate the index data corresponding to the programmed state of the memory cell.

Also, the system data manager 53 may change a storage location in which the index data is to be stored among the flag cells, which are configured to store the system data, according to a word line address generated by the address manager 54. The storage location or the flag cell, in which the index data is (to be) stored, may be represented by a column. Hereinafter, the storage location or the flag cell, in which the index data is (to be) stored, is referred to as a column. In other words, the system data manager 53 may generate the index data corresponding to the each of the addresses. The system data manager 53 may output the index data and information on a memory cell in which the index data is to be stored, respectively. In order to describe this, the address manager 54 will be described as follows.

The address manager 54 may distinguish the user data with respect to word lines and transmit an address of the word line representing the distinguished unit of the user data to the system data manager 53. For example, the address manager 54 may distinguish user data of a size of the second sub-block 2SB (see FIG. 3) with respect to word lines, relate the distinguished units of the user data to the respective word lines, and transmit each address of the word lines respectively related to the distinguished units of the user data to the system data manager 53. In other words, the address manager 54 may output addresses corresponding to the plurality of pages. Each of the addresses may indicate a page where user data is to be stored among the plurality of pages.

For example, when the user data related to the first word line is transmitted to the system memory 56 from the user data manger 52, the address manager 54 may transmit an address of the first word line to the system data manager 53 for the user data related to the first word line. When the user data related to the second word line is transmitted to the system memory 56 from the user data manager 52 after the user data related to the first word line is transmitted to the system memory 56, the address manager 54 may transmit an address of the second word line to the system data manager 53 for the user data related to the second word line. In this manner, the address manager 54 may transmit, to the system data manager 53, an address of a word line whenever the user data distinguished with respect to the word line is transmitted to the system memory 56 from the user data manager 52. The user data may be inverted or non-inverted in units of the second sub-blocks 2SB (see FIG. 3) for respective memory blocks according to the respective numbers of cycles of the memory blocks. In an embodiment, the inverted or non-inverted user data may be transmitted from the user data manager 52 to the system memory 56 at a time in units of the second sub-blocks 2SB. In an embodiment, the user data in units of the second sub-blocks 2SB and stored in the system memory 56 may be distinguished with respect to word lines. In an embodiment, addresses of the word lines related to the respectively distinguished units of the user data may be provided to the system data manager 53 for the distinguished units of the user data respectively related to the word lines. In other words, the addresses of the word lines may correspond to the pages, respectively. Specifically, each of the addresses of the word lines may indicate a page connected a word line.

The system data manager 53 may determine memory cells connected to different bit lines from among memory cells included in adjacent pages corresponding to consecutive addresses of the addresses, as memory cells in which index data corresponding to the consecutive addresses are to be stored. In other words, the system data manager 53 may change a column in which the system data is to be stored according to the word line address output from the address manager 54. For example, the system data manager 53 may change the column of the index data such that index data of consecutive word line addresses are not to be stored in the same column. When the column of the index data is changed, the arrangement of the index data within the data set may be changed since the column to store the index data and the arrangement of the index data within the system data or the data set are correlated. The system data manager 53 may generate the system data having various arrangements or patterns by changing the column of the index data. The system data manager 53 may transmit the generated system data to the system memory 56. The system data manager 53 may output the index data and information on a memory cell in which the index data is to be stored. The information may indicate a location where the index data is to be stored.

The system memory 56 may include buffer cells capable of temporarily storing data. For example, the buffer cells may be implemented with a dynamic random access memory (DRAM) or a static random access memory (SRAM). In addition, the buffer cells may be implemented with various types of cells. The system memory 56 may store various information necessary for an operation of the memory controller 1200. For example, the system memory 56 may include an address map table as information on a connection relationship between physical addresses and logical addresses, and temporarily store data in a program or read operation. The physical address may be an address used in the storage device 1100, and the logical address may be an address used in the host 1500. In a program operation, the system memory 56 may temporarily store a data set including user data and system data, the data set being related to a word line address, and then transmit the data set to the memory interface 58 under the control of the central processing unit 55.

The cycle counter 57 may count a number of cycles of a selected memory block in a program operation. The number of cycles of the selected memory block means a number of times program and erase operations are performed in the selected memory block. For example, when the program operation is performed once and the erase operation is performed once, the number of cycles increases by 1. The cycle counter 57 may transmit, to the user data manager 52, an accumulated number of cycles of the selected memory block in the program operation.

The memory interface 58 may transfer information between the memory controller 1200 and the storage device 1100. For example, in a program operation, the memory interface 58 may transmit a command output from the central processing unit 55, and a data set and an address, which are output from the system memory 56, to a selected memory device included in the storage device 1100. In a read operation, the memory interface 58 may transmit a data set output from the storage device 1100 to the system memory 56. An error of the data set transmitted to the system memory 56 may be detected and corrected by an error correction operation performed by an error corrector (not shown), and user data included in the data set may be output to the host 1500 through the host interface 51.

FIG. 6 is a diagram illustrating a program operation in accordance with an embodiment of the present disclosure.

Referring to FIGS. 5 and 6, when the host 1500 outputs a program request to the memory controller 1200 (S61), the memory controller 1200 may select a memory block on which a program operation is to be performed in response to the program request (S62). For example, the memory controller 1200 may select a block address of the memory block on which the program operation is to be performed.

When the cycle counter 57 transmits a number of cycles of the selected memory block to the user data manager 52, the user data manager 52 may compare the number of cycles with a reference value (S63). The reference value may be an odd or even number.

When the number of cycles of the selected memory block does not correspond to the reference value (NO), the user data manager 52 may transmit user data as non-inverted data to the system memory 56, and the system data manager 53 may generate system data related to the user data, and transmit the generated system data to the system memory 56. Since the user data is maintained as the non-inverted data, first index data may be included in the system data.

Subsequently, a data set temporarily stored in the system memory 56 may be transmitted to the memory interface 58, and the data set stored in the memory interface 58 may be output to the selected memory device (S66).

When the number of cycles of the selected memory block corresponds to the reference value (YES), the user data manager 52 may invert the user data (S64). The inverted user data may be transmitted to the system memory 56.

Subsequently, the system data manager 53 may generate system data related to the inverted user data. The system data manager 53 may generate second index data representing that the user data is the inverted data, and select a column to store the second index data according to a word line address (S65). For example, the system data manager 53 may change a column in which index data is to be stored whenever the word line address is changed.

When the inverted user data and the system data, which are generated in the operations S64 and S65, are transmitted to the system memory 56, the system memory 56 may transmit a data set including the user data and the system data to the memory interface 58, and the memory interface 58 may output the data set to the selected memory device (S66).

In the above-described embodiment, the column to store the second index data is changed when the number of cycles of the selected memory block corresponds to the reference value (YES). However, an operation of changing a column to store the first index data may be performed even when the number of cycles of the selected memory block does not correspond to the reference number (NO).

Figure 7A:
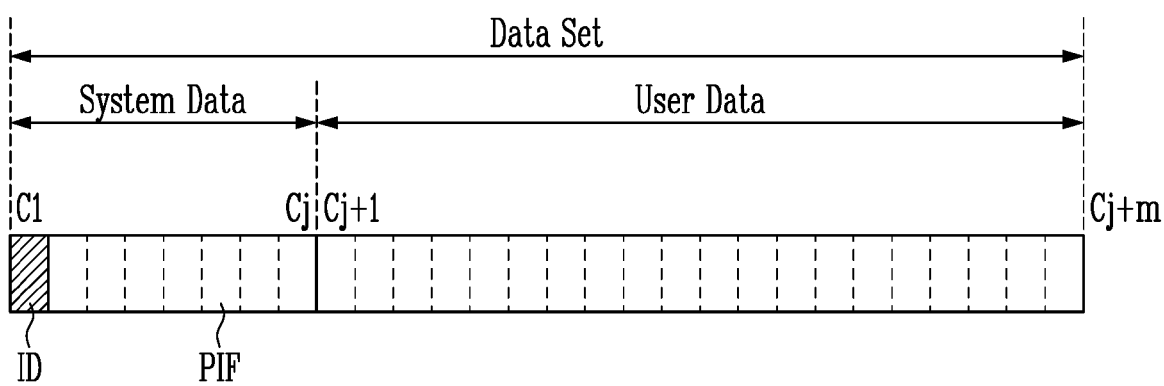
FIGS. 7A and 7B are diagrams illustrating a data set generated by the memory controller in accordance with an embodiment of the present disclosure.
Figure 7B:
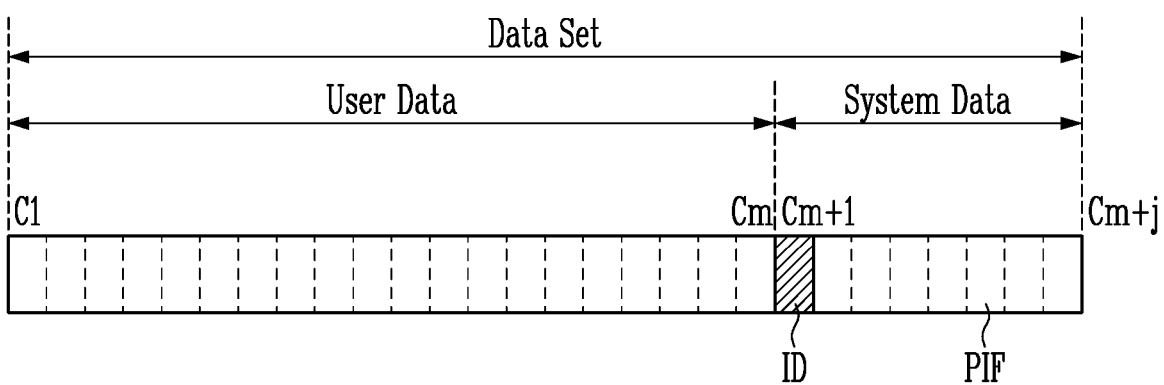

FIGS. 7A and 7B are diagrams illustrating a data set generated by the memory controller according to an embodiment of the present disclosure.

Referring to FIG. 7A, when (j+m)-bit data is stored in one page, first to (j+m)-th columns C1 to C(j+m) may be allocated to memory cells each in which 1-bit data is stored. The first bit line may be connected to a memory cell corresponding to the first column C1, and the (j+m)-th bit line may be connected to a memory cell corresponding to the (j+m)-th column C(j+m).

In one page, system data may be stored in memory cells corresponding to first to j-th columns C1 to Cj, and user data may be stored in memory cells corresponding to (j+1)-th to (j+m)-th columns Cj+1 to C(j+m).

The system data may include index data ID and page information PIF. The index data ID may be stored in any of the memory cells corresponding to first to j-th columns C1 to Cj. The page information PIF may be stored in memory cells corresponding to the other columns except a column corresponding to the memory cell to store the index data ID among the first to j-th columns C1 to Cj. The page information PIF may include various information on the user data. For example, the page information PIF may include logical page data information of the user data. The logical page data information is information which may be included in the system data in the MLC manner or more. For example, the user data may be determined as LSB data, CSB data, or MSB data according to the logical page data information.

Referring to FIG. 7B, unlike the drawing shown in FIG. 7A, an order in which system data and user data are stored may be changed. For example, the user data may be stored in memory cells corresponding to first to mth columns C1 to Cm, and the system data may be stored in memory cells corresponding to (m+1)-th to (m+j)-th columns Cm+1 to Cm+j.

Figure 8:
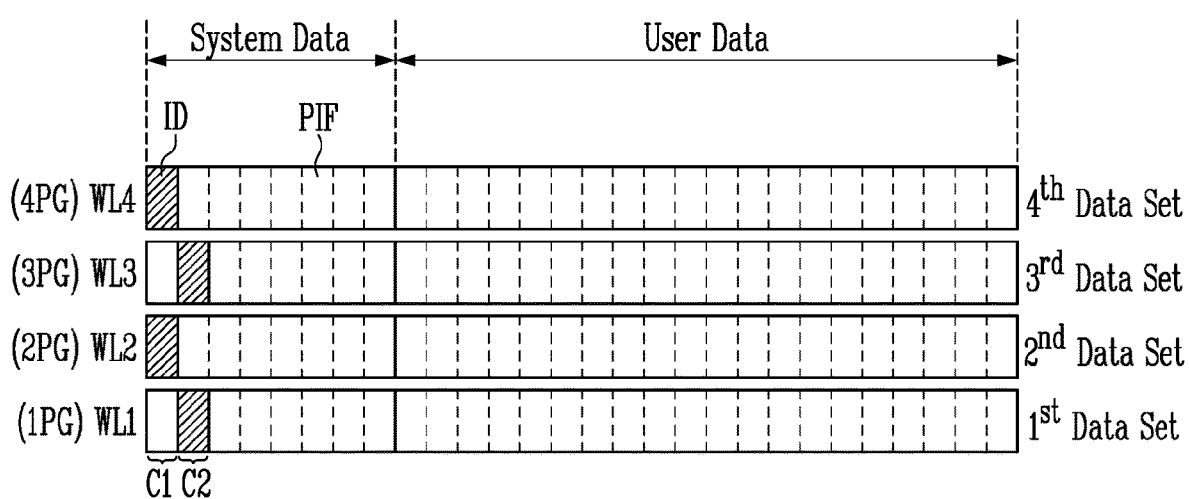
FIG. 8 is a diagram illustrating a pattern of system data including index data in accordance with an embodiment of the present disclosure.

FIG. 8 is a diagram illustrating a pattern of system data including index data according to an embodiment of the present disclosure.

Referring to FIG. 8, an arrangement or a pattern of system data including index data ID may be changed according to a page in which the index data ID is stored. The page is represented by a word line. As described above, the user data may be distinguished with respect to a word line, which means that the user data may be distinguished with respect to a page represented by the word line. A data set including the user data and the system data related to the user data may be stored in the page represented by the word line. The arrangement of the index data ID within the system data of the data set may vary according to the page to store the data set, which means that the arrangement of the index data ID within the system data may be changed according to the page in which the index data ID is stored. First to fourth word line addresses ADD_WL1 to ADD_WL4 will be described as an example. First to fourth data sets $1^{st}$ data set to $4^{th}$ data set may be stored in first to fourth pages 1PG to 4PG respectively represented by the first to fourth word lines WL1 to WL4. Index data ID to be stored in the first page 1PG may be stored in a memory cell corresponding to a second column C2, and index data ID to be stored in the second page 2PG may be stored in a column different from the second column C2. For example, the index data ID to be stored in the second page 2PG may be stored in a memory cell corresponding to a first column C1. When the index data ID to be stored in the second page 2PG is stored in the first column C1, index data ID to be stored in the third page 3PG may be stored in the second column C2 different from the first column C1. The other page information PIF except the index data ID in the system data may be stored in memory cells of the other columns except the column allocated to the memory cell to store the index data ID among the columns allocated to the system data.

A method for transmitting a data set generated by the memory controller to the memory device will be described in detail as follows.

Figure 9A:
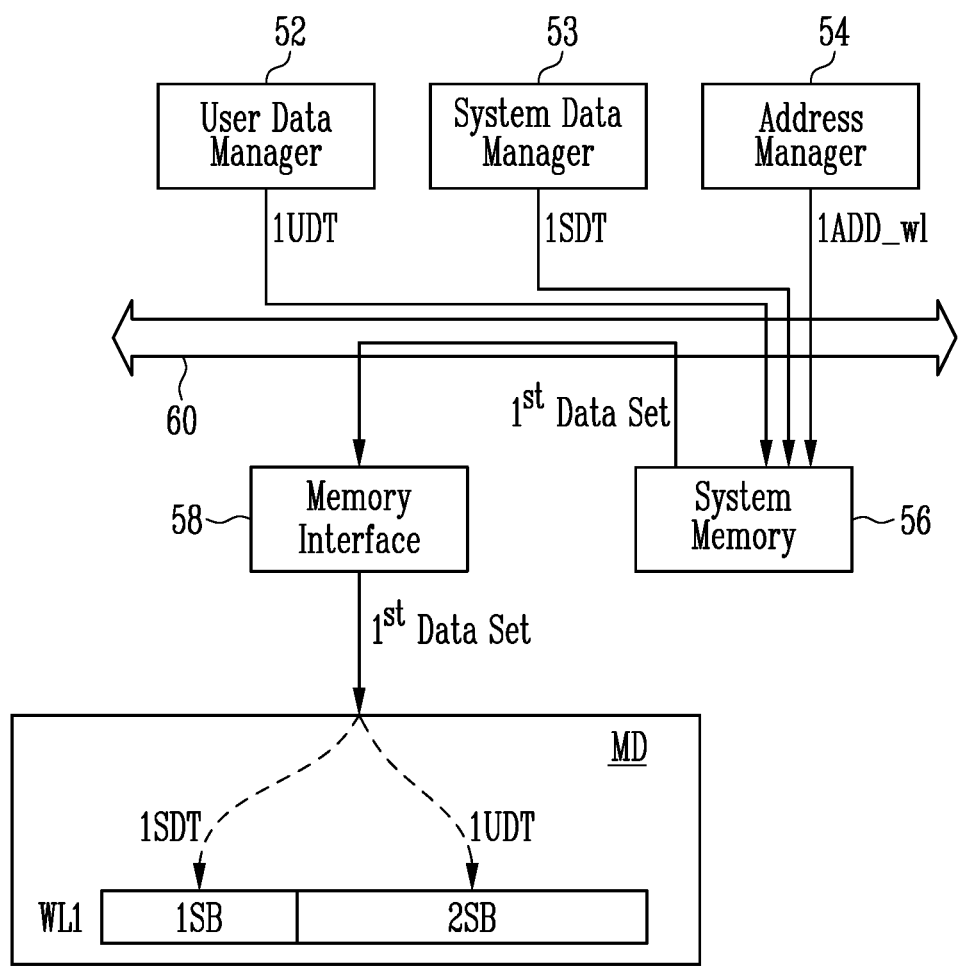
FIGS. 9A and 9B are diagrams illustrating a method for transmitting a data set generated by the memory controller to the memory device in accordance with an embodiment of the present disclosure.
Figure 9B:
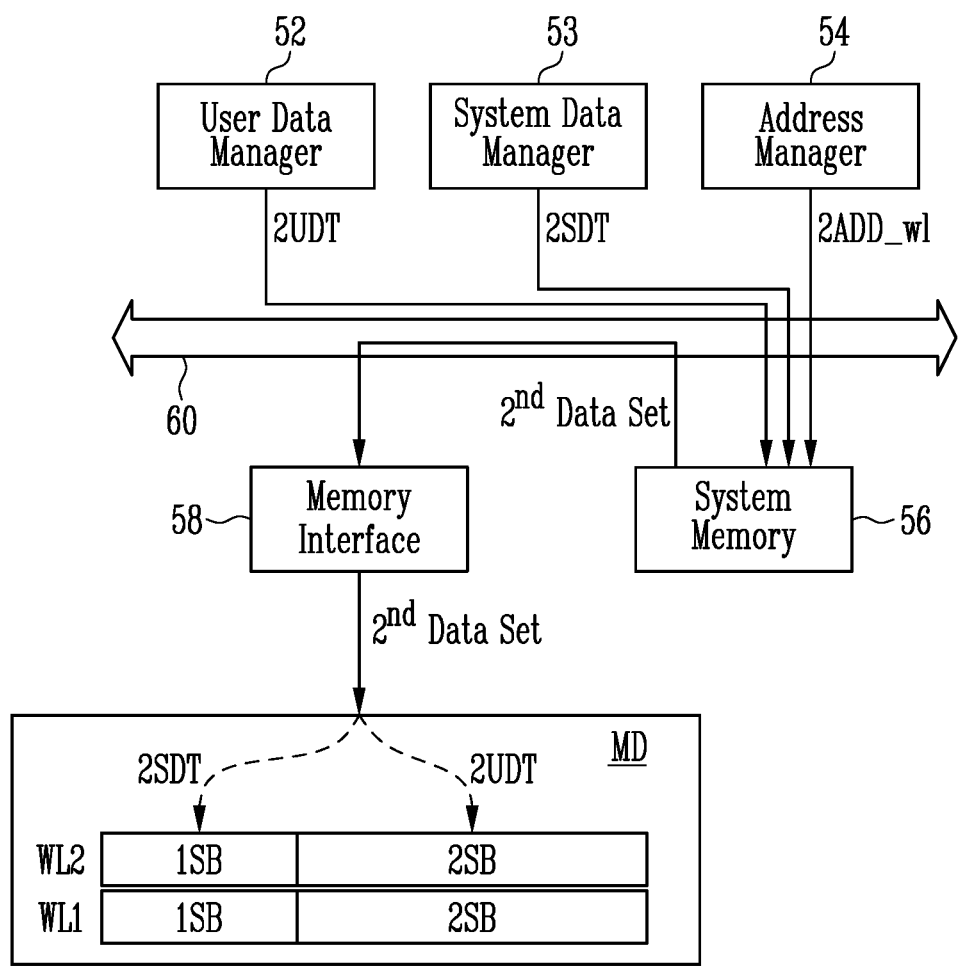

FIGS. 9A and 9B are diagrams illustrating a method for transmitting a data set generated by the memory controller to the memory device according to an embodiment of the present disclosure.

In FIG. 9A, a method is illustrated, in which the first data set $1^{st}$ data set is stored in a group of memory cells, e.g., a first page connected to the first word line WL1. In FIG. 9B, a method is illustrated, in which the second data set $2^{nd}$ data set is stored in a group of memory cells, e.g., a second page connected to the second word line WL2 after the first data set $1^{st}$ data set is stored in the first page.

Referring to FIG. 9A, the user data manager 52 may transmit first user data 1UDT, which is inverted or non-inverted, to the system memory 56, and the system data manager 53 may transmit first system data 1SDT related to the first user data 1UDT to the system memory 56. When the address manager 54 transmits a first word line address 1ADD_wl of a word line representing the first page and related to the first user data 1UDT to the system memory 56, the system memory 56 may transmit, to the memory interface 58, the first data set $1^{st}$ data set which includes the first user data 1UDT and the first system data 1SDT. The memory interface 58 may transmit, to the memory device MD, the first data set $1^{st}$ data set corresponding to the first word line address 1ADD_wl.

When the first data set is input, the memory device MD may store the first system data 1SDT in memory cells included in a first sub-block 1SB among the memory cells connected to the first word line WL1 and store the first user data 1UDT in memory cells included in a second sub-block 2SB among the memory cells connected to the first word line WL1. The memory cells to store the first system data 1SDT and the memory cells to store the first user data 1UDT may configure the first page.

Referring to FIG. 9B, when the first data set is stored in the first page, the user data manager 52 may transmit second user data 2UDT, which is inverted or non-inverted, to the system memory 56, and the system data manager 53 may transmit second system data 2SDT related to the second user data 2UDT to the system memory 56. When the address manager 54 transmits a second word line address 2ADD_wl of a word line representing the second page and related to the second user data 2UDT to the system memory 56, the system memory 56 may transmit, to the memory interface

58, a second data set $2^{nd}$ data set which includes the second user data 2UDT and the second system data 2SDT. The memory interface 58 may transmit, to the memory device MD, the second data set $2^{nd}$ data set corresponding to the second word line address 2ADD_wl.

When the second data set is input, the memory device MD may store the second system data 2SDT in memory cells included in the first sub-block 1SB among the memory cells connected to the second word line WL2 and store the second user data 2UDT in memory cells included in the second sub-block 2SB among the memory cells connected to the second word line WL2. The memory cells to store the second system data 2SDT and the memory cells to store the second user data 2UDT may configure the second page.

According to the above-described method, system data can be stored in a selected region (i.e., the first sub-block 1SB) within a memory block of the memory device, and a pattern of the system data stored in the selected region can be variously implemented. Various patterns of the system data will be described as follows.

Figure 10:
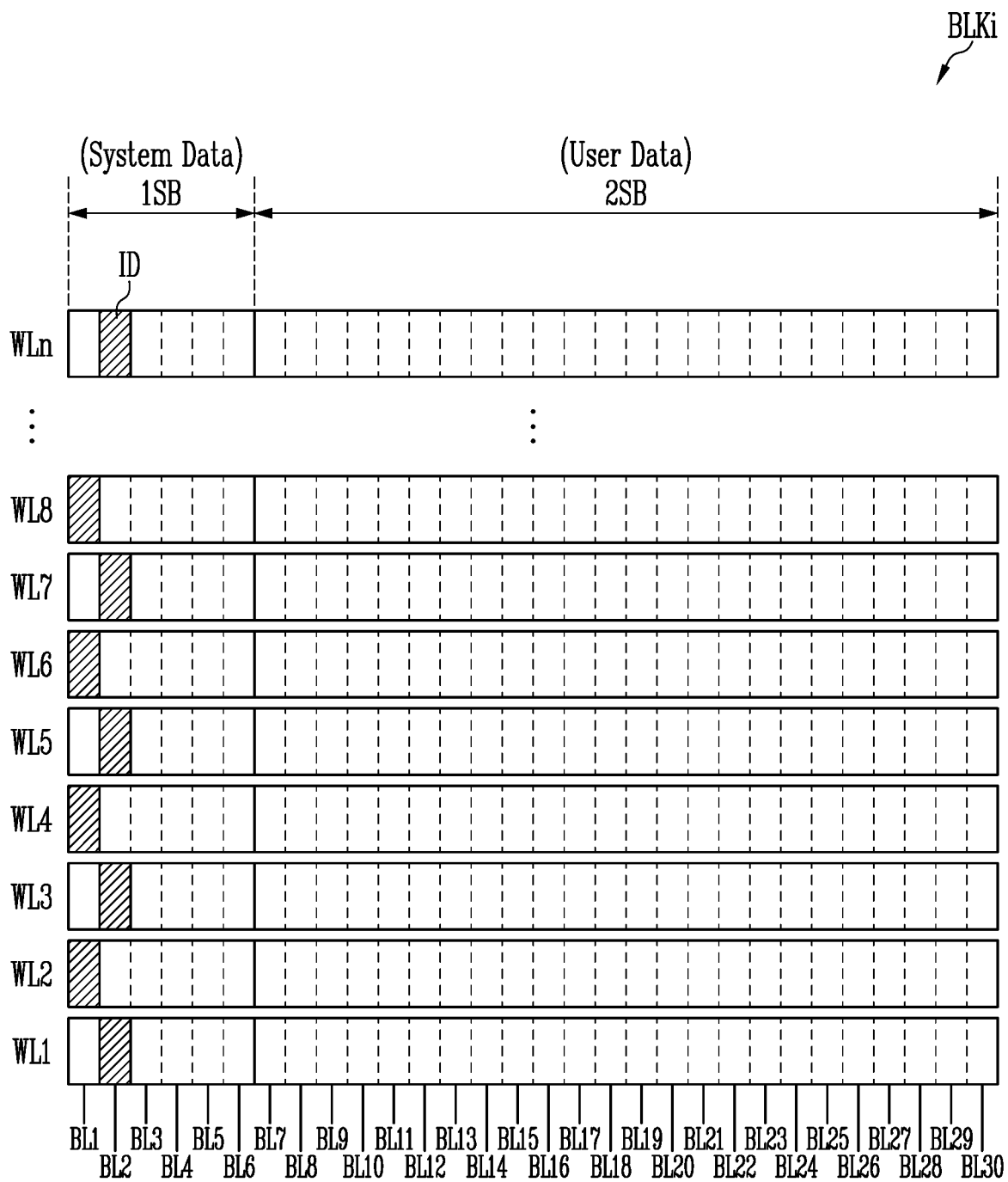
FIG. 10 is a diagram illustrating a pattern of system data in accordance with a first embodiment of the present disclosure.

FIG. 10 is a diagram illustrating a pattern of system data in accordance with a first embodiment of the present disclosure.

Referring to FIG. 10, the system data may include index data ID having a zigzag pattern. The index data may be selectively stored in memory cells connected to first or second bit line BL1 or BL2. For example, index data ID may be stored in memory cells connected to the second bit line BL2 in odd-numbered word lines WL1, WL3, WL5, . . . , and WLn, and index data ID may be stored in memory cells connected to the first bit line BL1 in even-numbered word lines WL2, WL4, WL6, . . . , and WLn−1. That is, the index data ID may be stored in the zigzag pattern in the memory cells such that the same index data ID is not stored in memory cells which are located on the same column and are adjacent to each other in a row direction.

Figure 11:
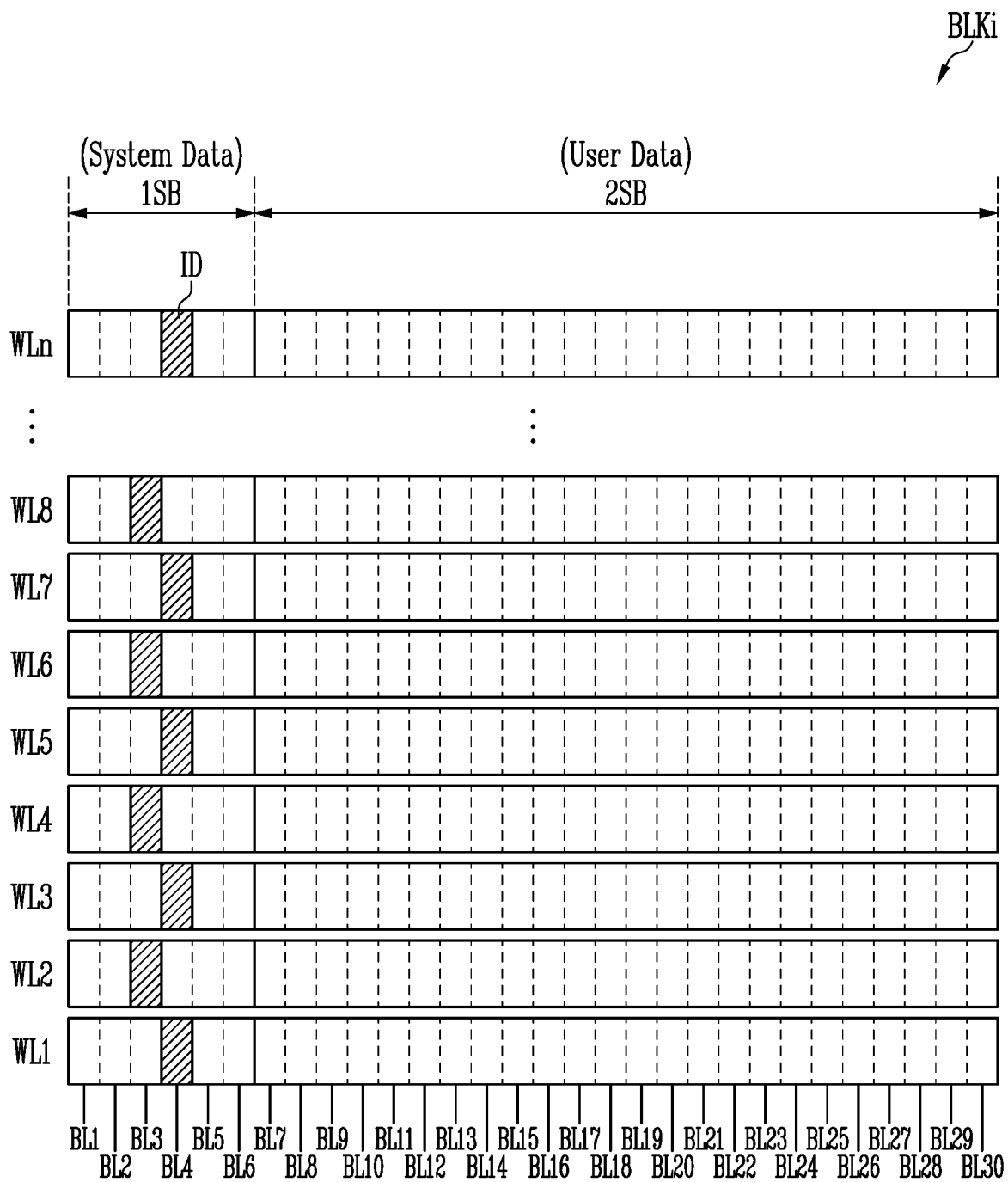
FIG. 11 is a diagram illustrating a pattern of system data in accordance with a second embodiment of the present disclosure.

FIG. 11 is a diagram illustrating a pattern of system data in accordance with a second embodiment of the present disclosure.

Referring to FIG. 11, the system data may include index data ID having a zigzag pattern, and the index data ID may be selectively stored in memory cells connected to a third or fourth bit line BL3 or BL4. For example, index data ID may be stored in memory cells connected to the fourth bit line BL4 in the odd-numbered word lines WL1, WL3, WL5, . . . , and WLn, and index data ID may be stored in memory cells connected to the third bit line BL3 in the even-numbered word lines WL2, WL4, WL6, . . . , and WLn−1. That is, in the second embodiment described with reference to FIG. 11, the index data ID may be stored in memory cells of columns corresponding to a middle spot of the first sub-block 1SB.

Figure 12:
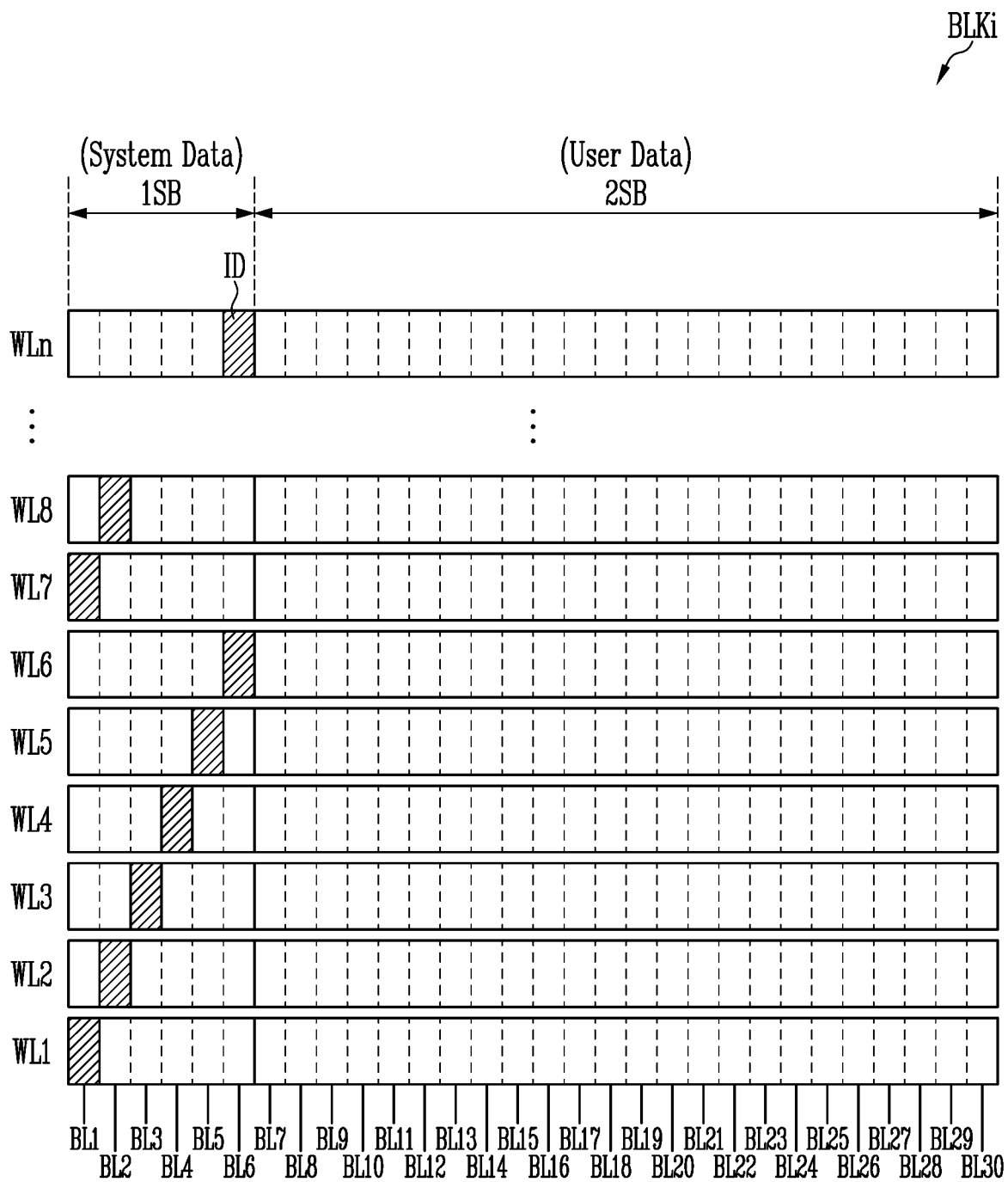
FIG. 12 is a diagram illustrating a pattern of system data in accordance with a third embodiment of the present disclosure.

FIG. 12 is a diagram illustrating a pattern of system data in accordance with a third embodiment of the present disclosure.

Referring to FIG. 12, the system data may include index data having a pattern in proportion to addresses of word lines and columns in a first sub-block 1SB. A case where each page included in the first sub-block 1SB is configured with 6 bits will be described as an example. First to sixth bit lines BL1 to BL6 may be connected to the first sub-block 1SB. Sequence numbers of the columns increase as sequence numbers of the bit lines increase. That is, the first bit line BL1 may correspond to a first column, and the second bit line BL2 may correspond to a second column. In this manner, the sixth bit line BL6 may correspond to a sixth column.

Index data ID corresponding to first to sixth word lines WL1 to WL6 may be respectively stored in memory cells in which the first to sixth word lines WL1 to WL6 and the first to sixth bit lines BL1 to BL6 overlap with each other. Index data ID corresponding to word lines from a seventh word line WL7 may be respectively stored in memory cells in which the word lines again overlap with the first to sixth bit lines BL1 to BL6. For example, the index data ID may be respectively stored in a memory cell connected to the first word line WL1 and the first bit line BL1, a memory cell connected to the second word line WL2 and the second bit line BL2, a memory cell connected to the third word line WL3 and the third bit line BL3, a memory cell connected to the fourth word line WL3 and the fourth bit line BL4, a memory cell connected to the fifth word line WL5 and the fifth bit line BL5, and a memory cell connected to the sixth word line WL6 and the sixth bit line BL6. Since the sixth bit line BL6 is a bit line corresponding to the maximum column of the first sub-block 1SB, index data ID may be stored in a memory cell connected to the first bit line BL1 from the seventh word line WL7.

Figure 13:
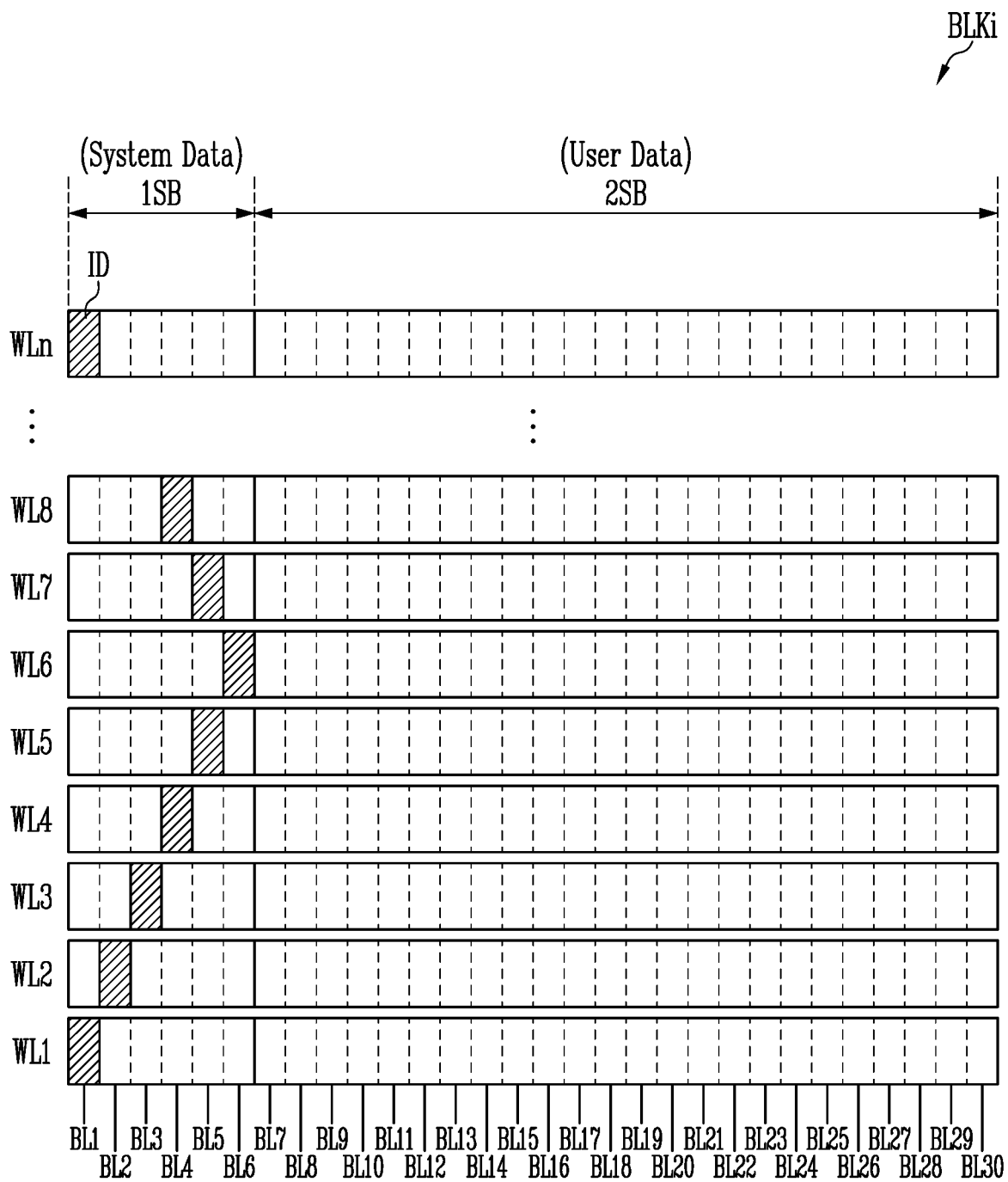
FIG. 13 is a diagram illustrating a pattern of system data in accordance with a fourth embodiment of the present disclosure.

FIG. 13 is a diagram illustrating a pattern of system data in accordance with a fourth embodiment of the present disclosure.

Referring to FIG. 13, the system data may include index data ID having a pattern in proportion to addresses of word lines and columns and a pattern in inverse proportion to addresses of word lines and the columns, which are continued.

A case where each page included in the first sub-block 1SB is configured with 6 bits will be described as an example. First to sixth bit lines BL1 to BL6 may be connected to the first sub-block 1SB. In the fourth embodiment, the index data ID may be stored in memory cells with a pattern in which sequence numbers of the columns increase from the minimum column to the maximum column and then decrease from the maximum column to the minimum column. That is, in proportion to the addresses of the word lines, the pattern of the memory cells in which the index data ID is stored may have a pattern in which the sequence numbers of the columns are sequentially increase or sequentially decrease.

Figure 14:
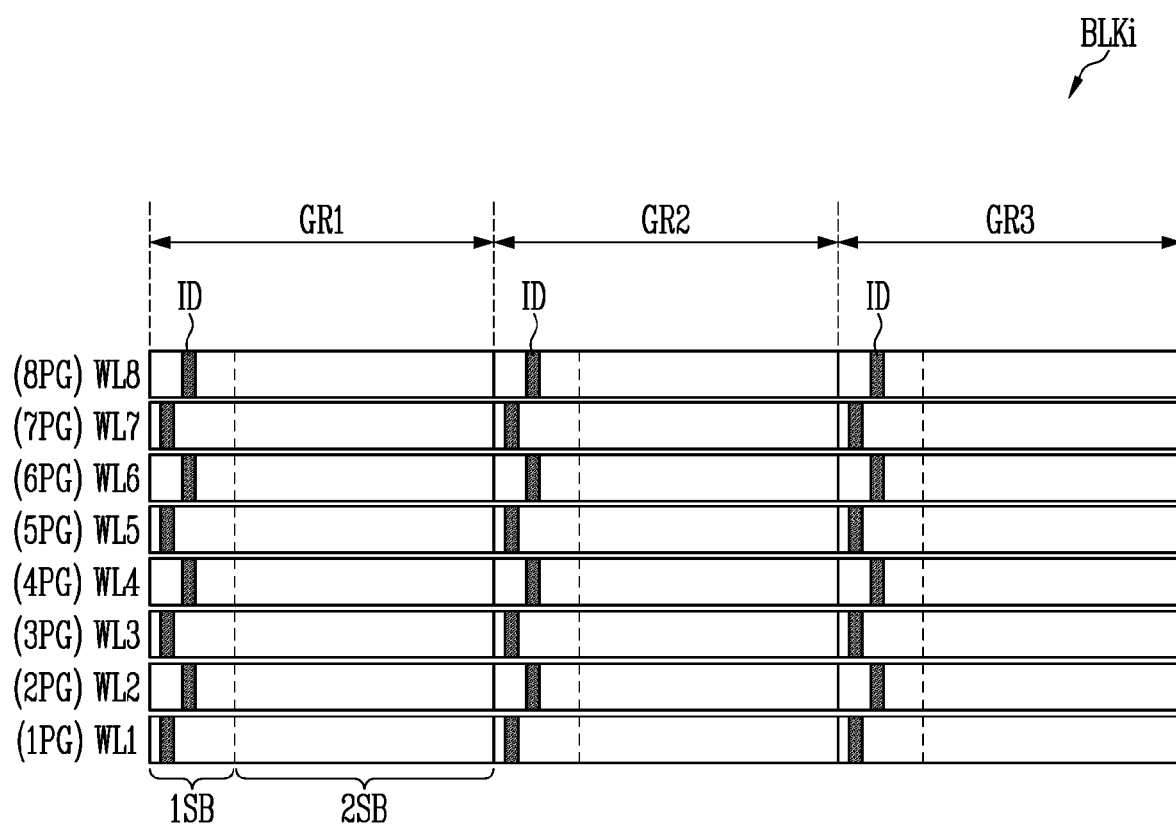
FIG. 14 is a diagram illustrating a pattern of system data in accordance with a fifth embodiment of the present disclosure.

FIG. 14 is a diagram illustrating a pattern of system data in accordance with a fifth embodiment of the present disclosure.

Referring to FIG. 14, an ith memory block BLKi may include a plurality of groups GR1 to GR3 divided in a column direction. For example, a first page 1PG distinguished by a first word line WL1 may be divided into the first to third groups GR1 to GR3, and a second page 2PG distinguished by a second word line WL2 may be divided into the first to third groups GR1 to GR3. In this manner, each of first to eighth pages 1PG to 8PG may be divided into the first to third groups GR1 to GR3. Each of different pages included in different groups may be divided into first and second sub-blocks 1SB and 2SB, and system data on user data of each group may be stored in a first sub-block 1SB included in the corresponding group. The system data may include index data ID and page information, and the index data ID may have a pattern in which the index pattern ID is not stored in memory cells of the same column in pages adjacent to each other.

Figure 15:
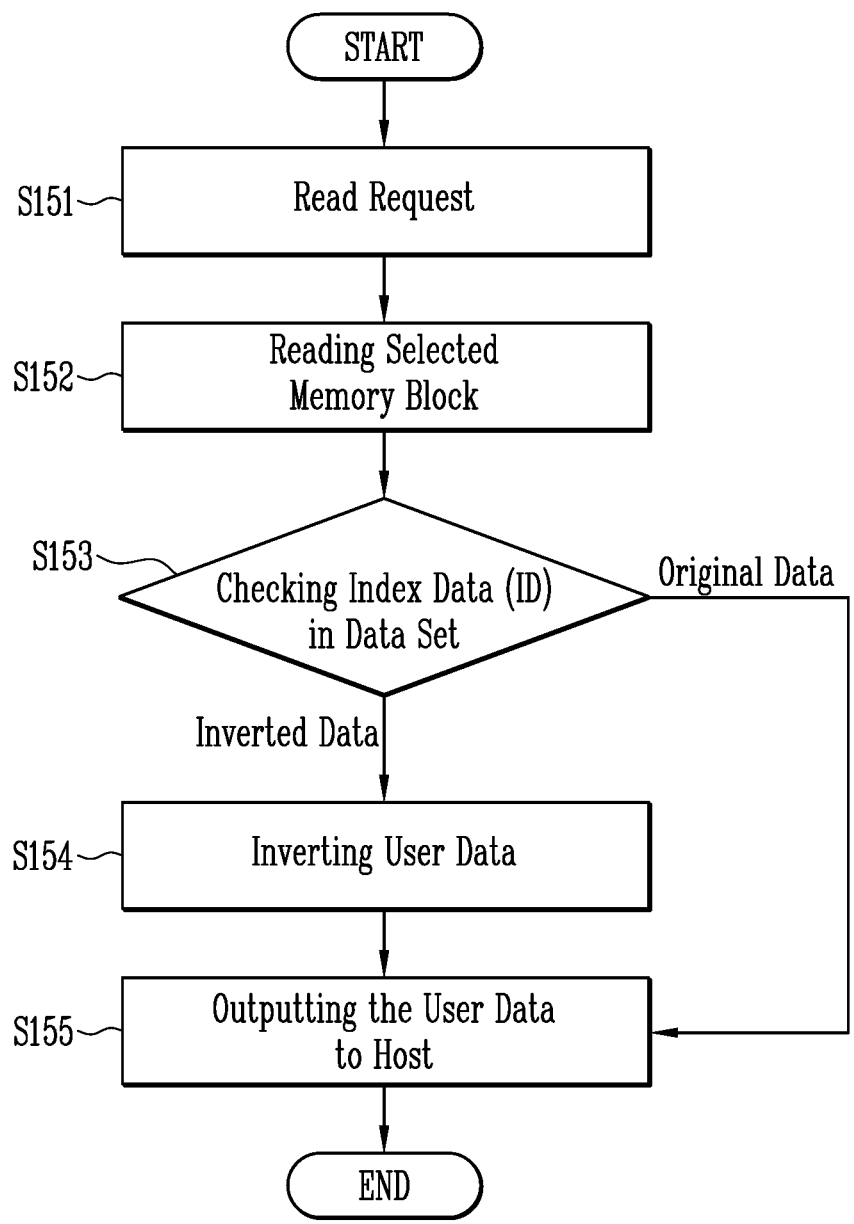
FIG. 15 is a diagram illustrating a read operation in accordance with an embodiment of the present disclosure.

FIG. 15 is a diagram illustrating a read operation in accordance with an embodiment of the present disclosure.

Referring to FIG. 15, when the host transmits a read request together with a logical address to the memory system (S151), the memory system may perform a read operation of a selected memory block according to a physical address corresponding to the logical address (S152). For example, the memory controller included in the memory system may generate a read command according to the read request, and detect a physical address corresponding to the logical address. Subsequently, the memory controller may transmit the read command and the physical address to a memory device. The memory device may output, to the memory controller, a data set read by performing the read operation of the selected memory block according to the physical address.

The memory controller may check index data ID included in the received data set and determine whether user data included in the data set is non-inverted data or inverted data (S153). Since a column in which the index data is stored has been changed according to word lines in a program operation, the memory controller may detect the index data ID from system data according to a word line address corresponding to the received data set in the read operation.

When the index data ID is the first index data, the memory controller may determine user data received from the memory device as non-inverted data. The memory controller outputs the user data received from the memory device to the host (S155).

In operation S153, when the index data ID is the second index data, the memory controller may determine the user data received from the memory device as inverted data. The memory controller may recover the inverted data received from the memory device to non-inverted data (S154), and output the non-inverted data as the user data to the host (S155).

Figure 16:
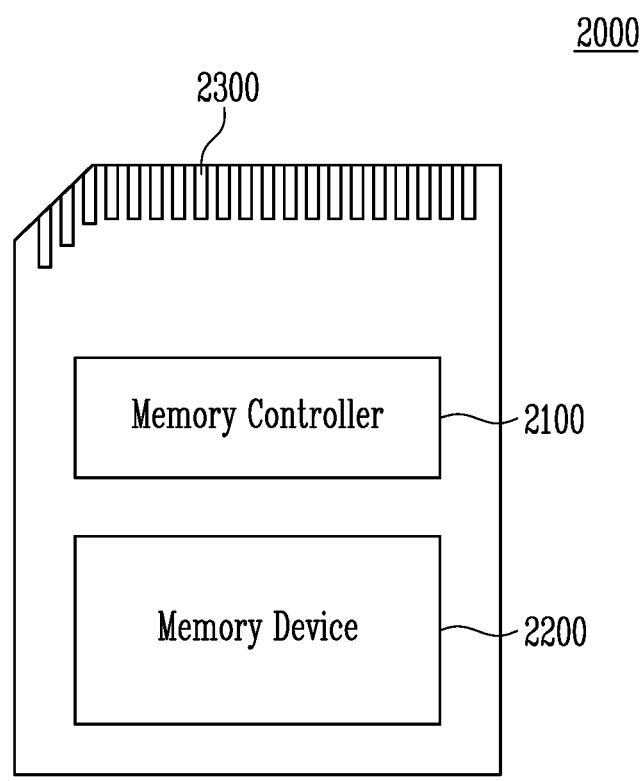
FIG. 16 is a diagram illustrating a memory card system to which the memory device according to an embodiment of the present disclosure is applied.

FIG. 16 is a diagram illustrating a memory card system to which the memory device of the present disclosure is applied.

Referring to FIG. 16, the memory card system 2000 includes a memory controller 2100, a memory device 2200, and a connector 2300.

The memory controller 2100 is connected to the memory device 2200. The memory controller 2100 may access the memory device 2200. For example, the memory controller 2100 may control a program, read or erase operation of the memory device 2200, or control a background operation of the memory device 2200. The memory controller 2100 provides an interface between the memory device 2200 and a host Host. The memory controller 2100 may include the units 51 to 58 included in the memory controller shown in FIG. 5, and the memory device 2200 may be configured identically to the memory device MD shown in FIG. 2.

The memory controller 2100 may communicate with an external device through the connector 2300. The memory controller 2100 may communicate with the external device (e.g., the host) according to a specific communication protocol. The memory controller 2100 may communicate with the external device through at least one of various communication protocols such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and NVMe. The connector 2300 may be defined by at least one of the above-described various communication protocols.

The memory device 2200 may be implemented with various nonvolatile memory devices such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), and a Spin Torque Transfer magnetic RAM (STT-MRAM).

The memory controller 2100 and the memory device 2200 may be integrated into a single semiconductor device, to constitute a memory card. For example, the memory controller 2100 and the memory device 2200 may constitute a memory card such as a PC card (Personal Computer Memory Card International Association (PCMCIA)), a Compact Flash (CF) card, a Smart Media Card (SM and SMC), a memory stick, a Multi-Media Card (MMC, RS-MMC, MMCmicro and eMMC), an SD card (SD, miniSD, microSD and SDHC), and a Universal Flash Storage (UFS).

Figure 17:
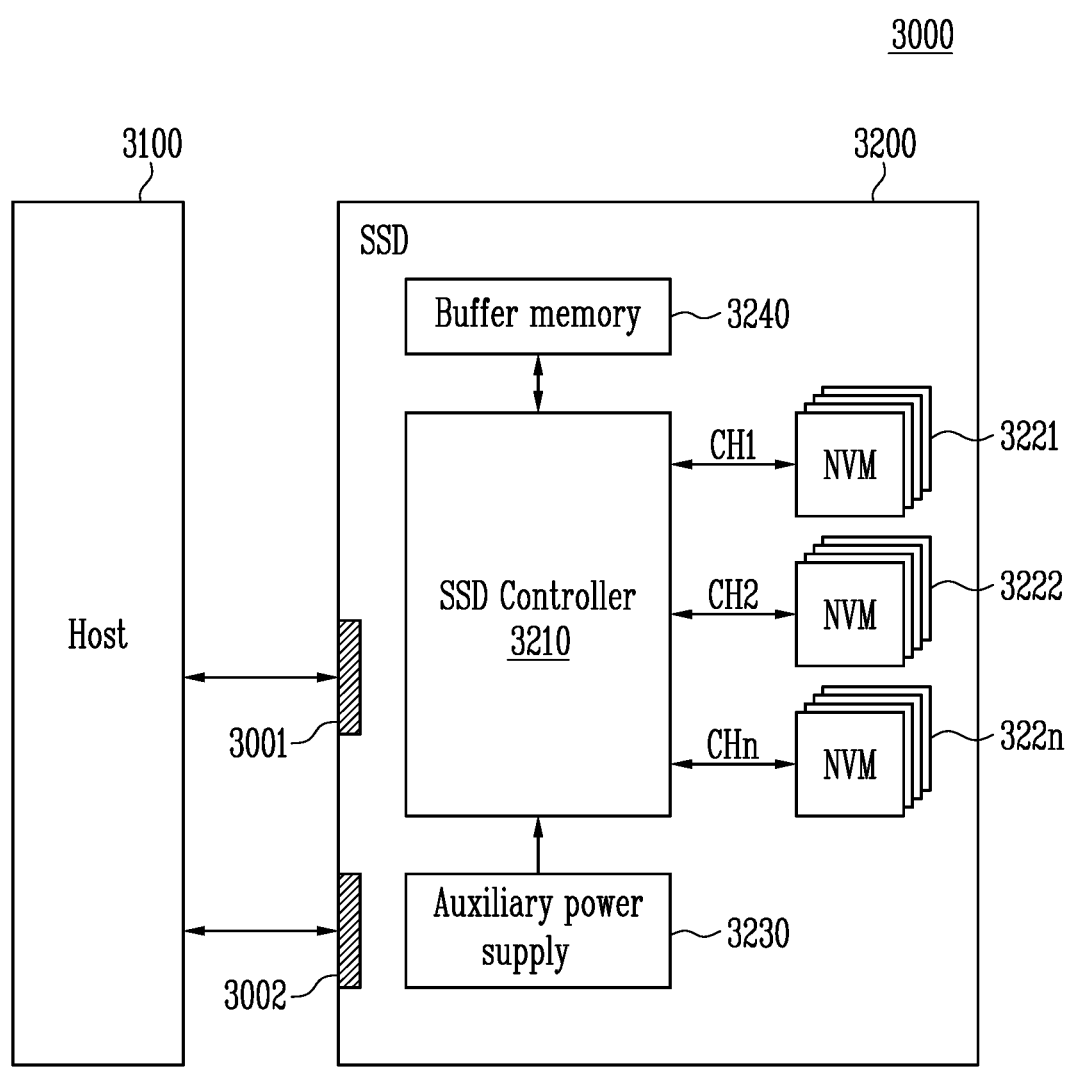
FIG. 17 is a diagram illustrating a Solid State Drive (SDD) to which the memory device according to an embodiment of the present disclosure is applied.

FIG. 17 is a diagram illustrating a Solid State Drive (SDD) to which the memory device of the present disclosure is applied.

Referring to FIG. 17, the SSD system 3000 includes a host 3100 and an SSD 3200. The SSD 3200 exchanges a signal with the host 3100 through a signal connector 3001, and receives a power voltage through a power connector 3002. The SSD 3200 includes an SSD controller 3210, a plurality of flash memories 3221 to 322n, an auxiliary power supply 3230, and a buffer memory 3240.

The flash memories 3221 to 322n shown in FIG. 17 may be configured identically to the memory device MD shown in FIG. 2. The SSD controller 3210 shown in FIG. 17 may include the units 51 to 58 included in the memory controller 1200 shown in FIG. 5.

The SSD controller 3210 may control the plurality of flash memories 3221 to 322n in response to a signal received from the host 3100. The signal may be a signal based on an interface between the host 3100 and the SSD 3200. For example, the signal may be a signal defined by at least one of interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), firewire, a Universal Flash Storage (UFS), a WI-FI, a Bluetooth, and an NVMe.

The auxiliary power supply 3230 is connected to the host 3100 through the power connector 3002. The auxiliary power supply 3230 may receive the power input from the host 3100, and charge the power. When the supply of power from the host 3100 is not smooth, the auxiliary power supply 3230 may provide power to the SSD 3200. The auxiliary power supply 3230 may be located in the SSD 3200, or be located at the outside of the SSD 3200. For example, the auxiliary power supply 3230 may be located on a main board, and provide auxiliary power to the SSD 3200.

The buffer memory 3240 may operate as a buffer memory of the SSD 3200. For example, the buffer memory 3240 may temporarily store information necessary for an operation of the SSD system 3000, separately from the system memory 56 shown in FIG. 5. The buffer memory 3240 may include volatile memories such as a DRAM, an SDRAM, a DDR SDRAM, an LPDDR SDRAM, and a GRAM or nonvolatile memories such as a FRAM, a ReRAM, an STT-MRAM, and a PRAM.

In accordance with the present disclosure, a phenomenon is prevented, in which the same data is stored in flag cells of the column, so that the reliability of a read operation of the flag cells can be improved.

While the present disclosure has been shown and described with reference to certain embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all steps may be selectively performed, or some or part of the steps may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

The embodiments of the present disclosure have been described in the drawings and specification. Although specific terminologies are used here, those are only to describe the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein. Further, it is noted that the present disclosure may be achieved in various ways through substitution, change, and modification that fall within the scope of the following claims, as those skilled in the art will recognize in light of the present disclosure.

What is claimed is:

1. A memory system comprising:
    a memory block including a plurality of pages, wherein each of the plurality of pages comprises a plurality of memory cells connected to bit lines and a word line of word lines;
    an address manager configured to output addresses corresponding to the plurality of pages, each of the addresses indicating a page where user data is to be stored among the plurality of pages; and
    a system data manager configured to generate index data corresponding to the each of the addresses, the index data indicating whether the user data is inverted, and output the index data and information on a memory cell in which the index data is to be stored, respectively,
    wherein the system data manager is configured to, determine memory cells connected to different bit lines from among memory cells included in adjacent pages corresponding to consecutive addresses of the addresses, as memory cells in which index data corresponding to the consecutive addresses are to be stored.

2. The memory system of claim 1, wherein the memory block includes:
    a first area in which system data comprising the index data corresponding to the each of the addresses are stored; and
    a second area in which the user data are stored.

3. The memory system of claim 1, further comprising:
    a cycle counter configured to count a number of cycles of program and erase operations performed in the memory block;
    a user data manager configured to maintain the user data as non-inverted data or change the user data to inverted data according to the number of cycles of the memory block;
    a system memory configured to store the user data and system data, and output a data set including the user data and the system data; and
    a memory interface configured to output the data set to a memory device including the memory block.

4. The memory system of claim 3, wherein the user data manager is configured to:
    determine whether the number of cycles corresponds to a reference value; and
    change the user data to the inverted data when the number of cycles corresponds to the reference value.

5. The memory system of claim 4, wherein the reference value is set to an even number or an odd number.

6. The memory system of claim 1, wherein the system data manager is configured to:
    generate first index data to be included in system data as the information of the user data when the user data are maintained as non-inverted data; and
    generate second index data to be included in the system data as the information of the user data when the user data are changed to inverted data.

7. The memory system of claim 6, wherein a memory cell, in which the first or second index data are stored, is maintained in an erase state according to the first index data or is programmed according to the second index data.

8. The memory system of claim 1, wherein the system data manager is configured to:
    control the memory block to store system data in memory cells connected to a first bit line, among memory cells connected to odd-numbered word lines of the word lines, and
    control the memory block to store the system data in memory cells connected to a second bit line, among memory cells connected to even-numbered word lines of the word lines.

9. The memory system of claim 1, wherein the system data manager is configured to:
    control the memory block to store system data in a memory cell connected to a first bit line, among memory cells connected to a selected word line of the word lines, and
    control the memory block to store the system data in a memory cell connected to a second bit line closest to the first bit line in a first direction, among memory cells connected to the next word line closest to the selected word line in a second direction.

10. A memory system comprising:
    a memory device including a first memory cell connected to a first bit line and a first word line, a second memory cell connected to a second bit line adjacent to the first bit line and the first word line, a third memory cell connected to the first bit line and a second word line adjacent to the first word line, and a fourth memory cell connected to the second bit line and the second word line; and
    a memory controller configured to transmit data sets including index data to the memory device in a program operation,
    wherein the memory controller is further configured to generate the data sets such that the index data are stored in the first to fourth memory cells.

11. The memory system of claim 10, wherein the memory controller includes a system data manager configured to allocate a memory cell connected to one of the first and second bit lines to the index data included in each of the data sets according to addresses of the first and second word lines.

12. The memory system of claim 11, wherein the system data manager is further configured to:

allocate, to the index data, a memory cell connected to one of the first and second bit lines, from among the first and second memory cells according to an address of the first word line; and allocate, to the index data, a memory cell connected to one of the first and second bit lines, from among the first and second memory cells according to an address of the second word line.

13. The memory system of claim 11, wherein the system data manager is further configured to:

generate the index data as first index data when non-inverted data of user data to be stored in a fifth memory cell connected to the first and second word lines is transmitted to the memory device; and generate the index data as second index data when inverted data of the user data to be stored in the fifth memory cell is transmitted to the memory device.

14. The memory system of claim 13, wherein the first and fourth memory cells are maintained in an erase state according to the first index data or are programmed according to the second index data.

15. The memory system of claim 13, wherein the system data manager is further configured to generate page information on the user data to be stored in the fifth memory cell and generate the data sets such that the page information is stored in the fifth memory cell.

16. A memory system comprising:

a memory block including a plurality of pages, wherein each of the plurality of pages comprises a plurality of memory cells connected to bit lines and a word line of word lines;

a peripheral circuit configured to program index data and user data in corresponding pages from among the plurality of pages; and a memory controller configured to generate the index data according to a state of the user data, and transmit the user data and the index data to the peripheral circuit, wherein the corresponding pages include a first page and a second page adjacent to each other, and wherein a bit line, connected to a memory cell of the first page storing first index data corresponding to the first page, is different from a bit line, connected to a memory cell of the second page storing second index data corresponding to the second page.

17. The memory system of claim 16, wherein the plurality of memory cells comprises memory cells of a first area for storing the index data and memory cells of a second area for storing the user data.

18. The memory system of claim 7, wherein the index data are stored in memory cells coupled to cross-points of different bit lines and different word lines connected to the first area.

19. The memory system of claim 16, wherein the memory controller is further configured to determine locations of memory cells in a column direction in which the index data are to be stored according to addresses of pages in which the index data are to be stored.

20. The memory system of claim 16, wherein the memory controller is configured to transmit the user data and the index data indicating whether the user data is inverted, to the peripheral circuit.

* * * * *